United States Patent [19]
Bernacchi et al.

[11] Patent Number: 5,159,204
[45] Date of Patent: Oct. 27, 1992

[54] STRUCTURE AND METHOD FOR PREVENTING LATCH-UP IN INTEGRATED CIRCUITS

[76] Inventors: Jerald R. Bernacchi, 24213 Summerhill, Los Altos, Calif. 94022; Graham Y. Mostyn, 19845 Viewridge Dr., Saratoga, Calif. 95070; Mohammad Yunus, 4860 Porter St., Fremont, Calif. 94538

[21] Appl. No.: 123,056

[22] Filed: Nov. 18, 1987

[51] Int. Cl.⁵ .......................................... H03K 19/003
[52] U.S. Cl. .............................. 307/200 B; 307/443; 307/362; 307/296 R; 357/42
[58] Field of Search .................... 307/200 B, 443, 494, 307/497, 362, 363, 577, 574, 585, 296 R, 297; 357/42

[56] References Cited
U.S. PATENT DOCUMENTS

| | | | |
|---|---|---|---|
| 4,142,114 | 2/1979 | Green | 307/297 X |
| 4,327,368 | 4/1982 | Uchida | 307/296 R X |
| 4,353,105 | 10/1982 | Black | 307/200 B X |
| 4,571,505 | 2/1986 | Eaton, Jr. | 307/296 R X |
| 4,631,421 | 12/1986 | Inoue et al. | 307/296 R X |
| 4,647,956 | 3/1987 | Shrivastava et al. | 357/42 |
| 4,670,668 | 6/1987 | Liu | 307/297 X |
| 4,723,081 | 2/1988 | Akatsuka | 307/200 B |

Primary Examiner—David Hudspeth

[57] ABSTRACT

A circuit and method for avoiding latch up in an integrated circuit in which the base-emitter junction of a parasitic bipolar transistor forming part of a parasitic SCR structure is monitored. If the forward bias of the monitored base-emitter junction approaches a predetermined value, the operation of the circuit is altered to prevent activation of the SCR.

24 Claims, 6 Drawing Sheets

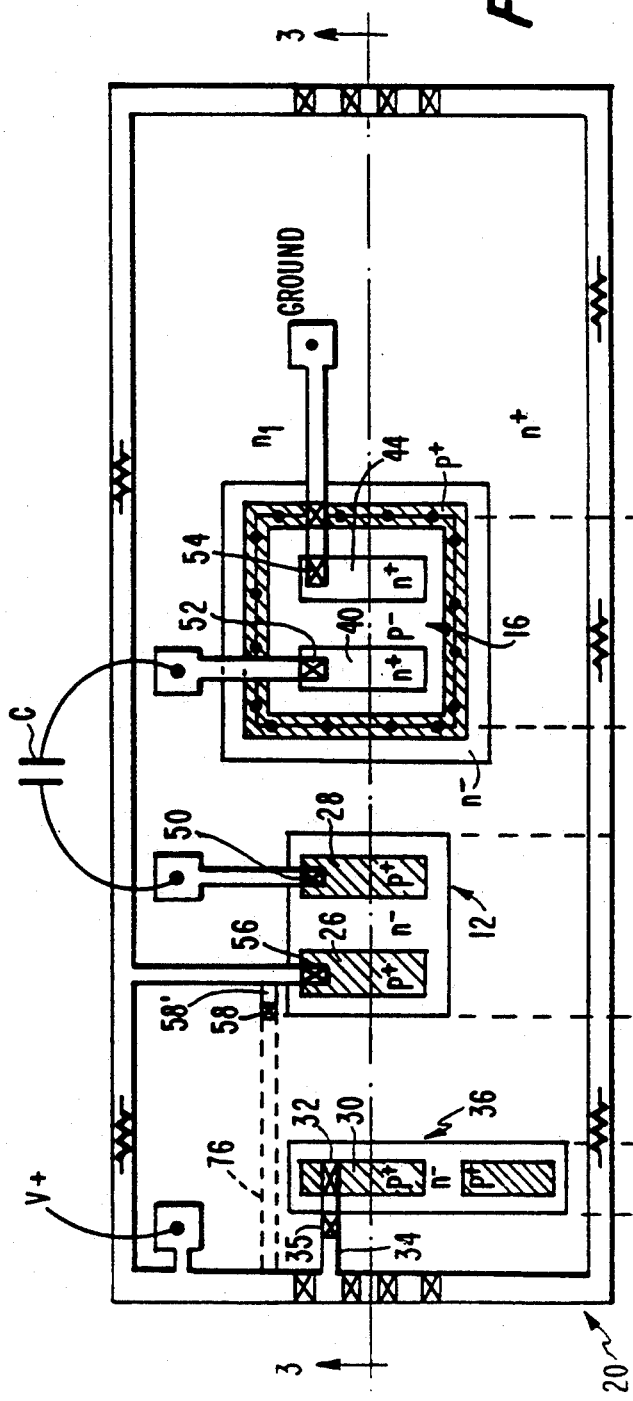
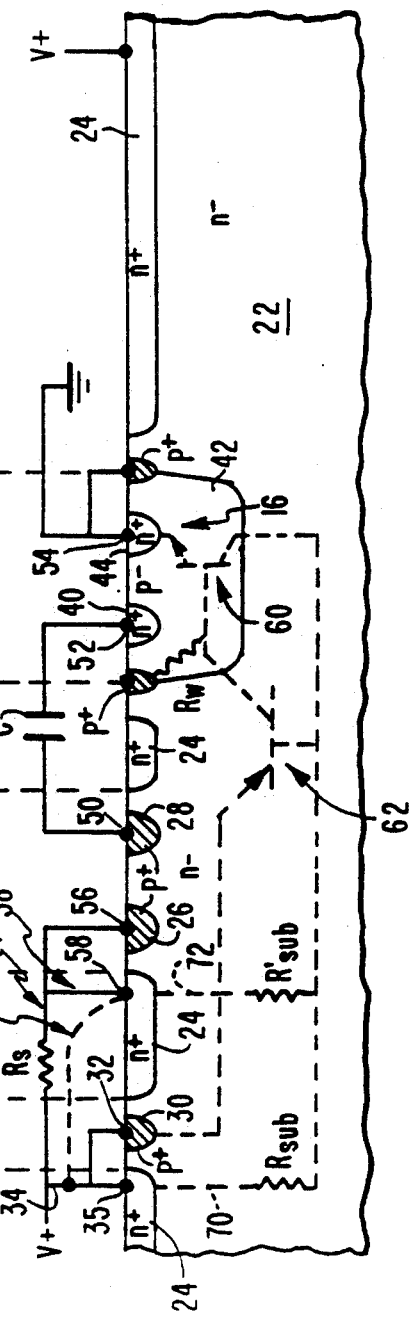
FIG. 2
FIG. 3

STRUCTURE AND METHOD FOR PREVENTING LATCH-UP IN INTEGRATED CIRCUITS

BACKGROUND OF THE INVENTION

1. Field of the Invention.

The present invention relates to integrated circuits, and more particularly, to such circuits employing metal oxide semiconductor (MOS) technology.

2. Description of Related Art.

Monolithic complementary metal oxide semiconductor (CMOS) integrated circuits have transistors of both carrier types, that is, P-channel and N-channel transistors. One such transistor carrier type may be formed directly into the substrate of the device. For example, if the substrate has been doped to an N conductivity type, P-channel transistors may be formed directly into the substrate. However, the transistors of the opposite carrier type, N-channel transistors, are typically formed in P-type wells formed within the N-type substrate.

One problem inherent with CMOS integrated circuits of this nature is that an N+ diffusion region in a P well can create a parasitic vertical NPN bipolar transistor. Similarly, a P+ diffusion region adjacent a P− well can form a parasitic lateral PNP bipolar transistor. Accordingly, the substrate of the device could function as a common base for each of the PNP parasitic devices, and could also function as a common collector for the NPN parasitic transistors.

Under certain circumstances, the base-emitter junction of the PNP transistor may become forward biased, activating not only the PNP transistor but also a nearby NPN parasitic transistor. Two such activated transistors can function as a silicon controlled rectifier (SCR) such that even after the condition which initially caused the forward biasing of the base-emitter junction of the PNP transistor disappears, the SCR can remain turned on. This condition is often referred to as "latch-up" and can cause an undesirable high current to be drawn from the device power supply which can cause destruction of the device.

Previous attempts to prevent latch-up have been directed primarily at reducing the resistance of certain current paths through the metallization lines, substrates or wells, as appropriate. In addition, the gain of the lateral and vertical parasitic bipolar transistors can also be reduced by various processing techniques to reduce the likelihood of inadvertent activation of an SCR structure. For example, guard rings can reduce the number of minority carriers in the substrate to thereby reduce the effective gain ($\beta$) of the parasitic lateral transistor. However, where significant transient currents may be present in the device, these prior techniques have often been found to be either insufficient or inconvenient to apply in various applications.

SUMMARY OF THE INVENTION

It is an object of the present invention to provide an integrated circuit in which the occurrence of latch-up is substantially eliminated. This is achieved by monitoring the base-emitter junction of at least one of the parasitic transistors of an SCR structure and controlling the bias across the base-emitter junction in such a manner as to ensure that the base-emitter junction remains reverse biased or at a limited degree of forward bias. In the illustrated embodiment, a comparator circuit is provided to compare the supply voltage to the potential of the substrate adjacent the base-emitter junction of one or more of the parasitic lateral transistors likely to participate in an SCR activation. In the event the voltage of the substrate falls below a predetermined value relative to the supply voltage, corrective action is undertaken to prevent further lowering of the substrate voltage. For example, current through the one or more switches may be limited to enable the substrate voltage to return to a level which will ensure that the parasitic transistor does not conduct. Also, portions of the circuit may be shut off to limit conduction through the substrate. In this manner, the base-emitter junction of the lateral transistor is not allowed to become sufficiently forward biased to turn the transistor on, thereby effectively preventing activation of the SCR structure and any ensuing latch-up condition.

These and other objects and advantages will become more clear in connection with the following detailed description and the accompanying drawings of which:

BRIEF DESCRIPTION OF THE DRAWINGS

FIG. 2 is a schematic representation of a semiconductor device implementing the circuit of FIG. 1 and incorporating an embodiment of the invention;

FIG. 3 is a cross-sectional view of the device of FIG. 2;

DETAILED DESCRIPTION OF THE DRAWINGS

Figure 1:
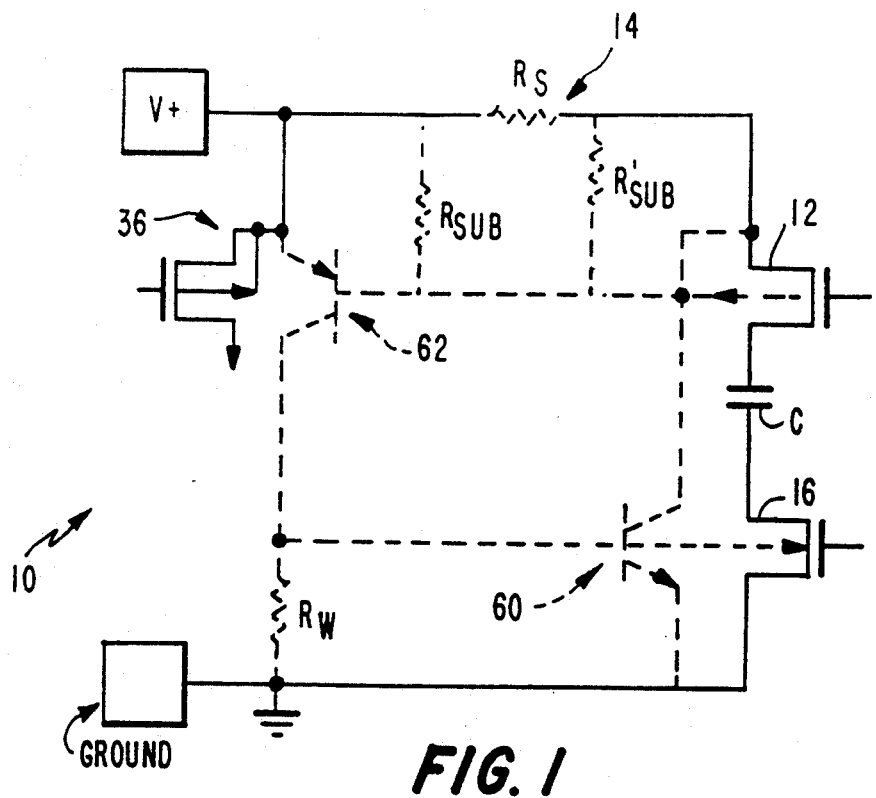
FIG. 1 is a schematic diagram of a switched capacitor circuit.

FIG. 1 shows a switched capacitor circuit 10 which is susceptible to latch-up. The circuit 10 is shown for purposes of illustration in that other types of circuits are also susceptible to latch up. The circuit 10 includes a capacitor C which is coupled at one end by an input P-channel transistor switch 12 to a supply voltage input line 14. An N-channel transistor switch 16 couples the other end of the capacitor C to ground. When the transistors 12 and 16 are both turned on, the input supply voltage is applied across the capacitor C and stored for use by other portions of the circuit (not shown).

FIGS. 2 and 3 show a schematic representation of an integrated circuit device 20 which implements the switched capacitor circuit 10 of FIG. 1. As shown therein, the device 20 has an N− substrate 22 and an N+ contact region 24 formed within the substrate 22. The P-channel transistor 12 includes a P+ source diffusion region 26 formed within the N− substrate 22. A second P+ diffusion region 28 formed within the N− substrate 22 and spaced from the source region 26 functions as the drain of the P-channel transistor 12. Overlying insulator and gate layers have been omitted for clarity. A third P+ diffusion region 30 is coupled by a contact 32 and a metallization line 34 to the input supply voltage. The metallization line 34 also contacts the N+ contact region at 35, coupling the substrate to the supply voltage. The region 30 is the source region of another P— channel transistor 36 of another portion of the circuit.

The N-channel transistor 16 includes a first N+ drain diffusion region 40 formed within a P— well 42 which is in turn formed within the N— substrate 22. A second N+ diffusion region 44 formed within the P— well 42 and spaced from the drain region 40 provides the source region of the transistor 16. One end of the capacitor C (external to the device 20) is connected by a contact 50 to the drain region 28 of the transistor 2. The other end of the capacitor C is connected by a similar contact 52 to the drain region 40 of the transistor 16. The source of the transistor 16 is connected by a contact 54 to ground. Finally, the metallization line 14 to the supply voltage contacts the source region 26 of the transistor 12 and the N+ region 24 at 56 and 58, respectively.

As can be best seen in FIG. 3, the source region 44 of the transistor 16 together with the underlying portion of the P— well 42 and the substrate 22 can form a parasitic vertical NPN bipolar transistor as indicated in phantom at 60. In addition, the P+ source region 30 together with the adjacent substrate 22 and the P— well 42 can form a parasitic lateral PNP bipolar transistor as indicated in phantom at 62. Thus, the P— well 42 can function as both the base of the parasitic NPN transistor 60 and the collector of the parasitic PNP transistor 62. Similarly, the substrate 22 can function as both the base of the parasitic PNP transistor 62 and the collector of the parasitic NPN transistor 60. Coupled in this manner, the parasitic transistors 60 and 62 can form a silicon controlled rectifier (SCR) structure. Where the substrate is P-type rather than N-type, the physical placement of the parasitic NPN and PNP transistors is interchanged.

The substrate 22 has an inherent resistance designated $R_{sub}$ for the substrate current path 70 terminating adjacent the supply voltage contact 35. A second current path 72 terminating adjacent the supply voltage contact 58 has an inherent resistance $R'_{sub}$. Because of the inherent resistance $R_s$ of the supply voltage input line 14, the voltage of the substrate adjacent the contact 58 is affected by the current through the input line 14 to the transistor switch 12. A sufficiently large transient current can, under certain circumstances, drop the voltage of the substrate so as to forward bias the base-emitter junction sufficiently to turn on the parasitic PNP bipolar transistor 62. The parasitic PNP transistor 62 can in turn turn on the parasitic NPN transistor 60 of the SCR structure. With the parasitic SCR turned on, the SCR can remain turned on, even after the transient current condition which initially turned on the lateral transistor 62 is no longer present. As a result, the device 20 can draw excessive amounts of power potentially leading to the destruction of the device.

One prior approach to prevent latch-up has been to decrease the resistance of the metallization lines by, for example, increasing the size of the metallization lines. However, this approach is not always practical, particularly where space is at a premium. Moreover, localized substrate voltages are not always affected simply by currents through metallization lines but may also be affected by currents through the substrate itself or the diffusion wells. In such cases, there have been attempts to reduce the resistance of such current paths through doping. Still another approach has been to use guard rings and other techniques to reduce the gain ($\beta$) of the parasitic transistors. However, these techniques are not always effective in preventing latch-up from occurring and are not always practical for many applications.

In one aspect of the invention, latch-up can be prevented by providing a second metallization line 76 (indicated in phantom) between the power supply and the substrate contact 58 and removing line 58'. Specifically, the second metallization line 76 prevents current flow through the substrate to the source region 26 of the transistor 12. In addition, the potentials of the substrate and P-channel source region 26 can be independent. The metallization line 76, carrying only minimal current, will not suffer the voltage drop that a large transient current through the metallization line 14 could cause at the source region 26. Consequently, the substrate would remain substantially at the supply voltage, preventing turn on of the PNP transistor 62 and any ensuing latch-up.

Figure 4:
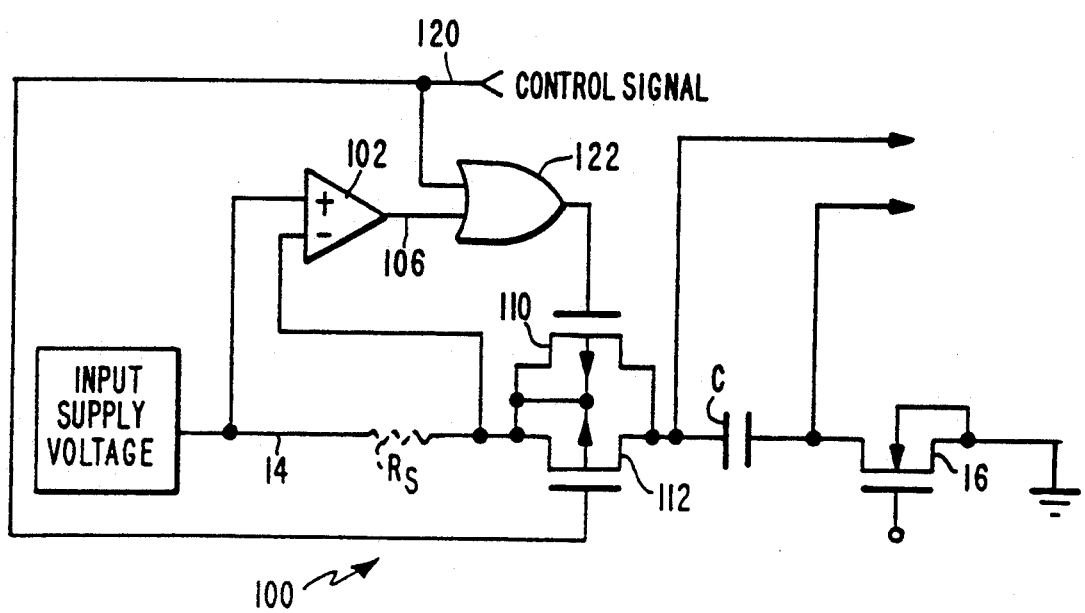
FIG. 4 is a schematic diagram of a switched capacitor circuit in accordance with a preferred embodiment of the present invention.
Figure 5:
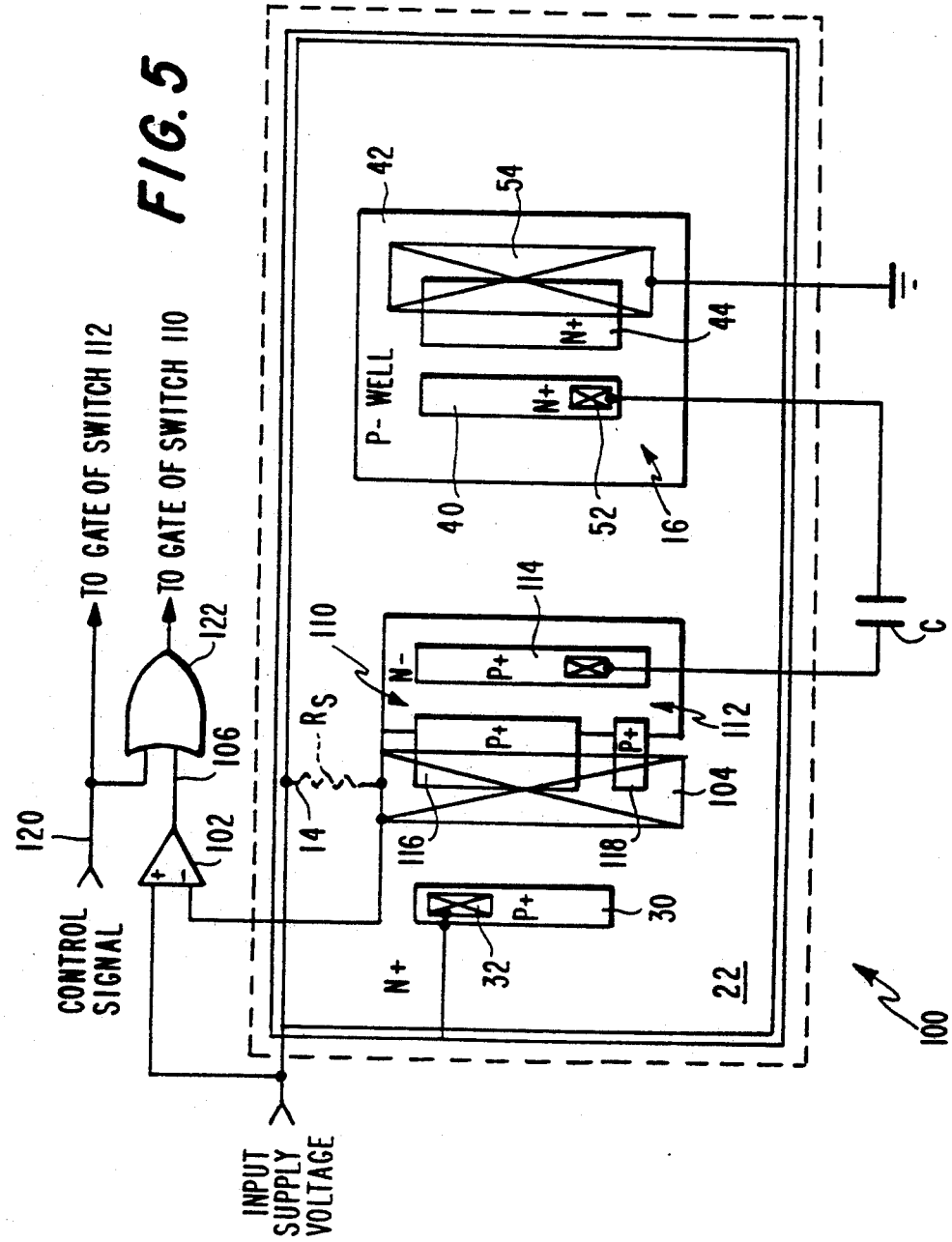
FIG. 5 is a schematic representation of a semiconductor device incorporating the circuit of FIG. 4.

Referring now to FIGS. 4 and 5, a switched capacitor circuit in accordance with another embodiment of the present invention is indicated generally at 100. The circuit 100 avoids latch-up by monitoring the potential of the substrate adjacent an SCR structure which is likely to be activated, and taking corrective action as appropriate to prevent the turn on of the SCR structure. Such an approach is applicable where an additional metallization line as described above is impractical or otherwise ineffective to prevent latch-up.

In the illustrated embodiment, the circuit 100 includes a comparator 102 having a non-inverting input coupled to the input supply voltage and an inverting input coupled to the substrate 22 by a contact 104 (FIG. 5). The comparator 102 monitors the potential difference applied across the base-emitter junction of the lateral parasitic transistor and provides a more positive or logic 1 output signal at an output 106 should the base-emitter voltage become forward biased by more than a predetermined value. In the illustrated embodiment, this predetermined value is chosen to be 0.4 volts so that the comparator 102 provides a more positive output to indicate that the PNP transistor 62 is approaching the point of conduction. The more positive output is defined herein as a "logical 1" state.

Replacing the transistor switch 12 of FIG. 1, the circuit 100 of FIGS. 4 and 5 has a pair of parallel P-channel transistor switches 110 and 112 which are shown in FIG. 5 to share a common P+ drain diffusion region 114. The transistor switches 110 and 112 have separate source diffusion regions 116 and 118, respectively, and separate gate electrodes (not shown). The source region 118 and gate electrode of the transistor switch 112 are significantly smaller than those of the transistor switch 110 so that the switch 112 has a larger effective series resistance, which will restrict the amount of current allowed to flow through the switch 112.

To turn on the transistor switch 112, a control signal on a line 120 is applied to the gate of the transistor switch 112. The circuit 100 includes an OR gate 122 having one input coupled to the output 106 of the comparator 102, and a second input coupled to the control signal line 120. The output of the OR gate 122 is coupled to the gate of the transistor switch 110. Consequently, when the output of the comparator 102 changes to a logical 1 indicating that the PNP transistor 62 is approaching the point of conduction, the output of the OR gate 122 also assumes a logical 1 output, thereby blocking the control signal from the gate of the transistor switch 110. In this manner, the transistor switch 110 is disabled which leaves only the smaller switch 112 to continue to charge the capacitor C. As a result, the current through the input line 14 is significantly reduced, reducing the voltage drop in the line and across the base-to-emitter region of the parasitic transistor thereby preventing conduction by the lateral PNP parasitic transistor. Thus, the SCR structure is not permitted to turn on and the impending latch-up is prevented.

Once the potential of the substrate has risen sufficiently to change the output of the comparator 102, the transistor switch 110 is again enabled, allowing the switch 110 to resume charging the capacitor C in parallel with the transistor switch 112. By this time, however, the transient condition which initiated the disabling of the transistor switch 110 may have ended. If not, the comparator 102 and OR gate 122 will continue to disable the transistor switch 110 until the transient current condition is no longer present.

It is seen from the above that the base-emitter junction of the PNP transistor 62 is normally reverse biased, zero-biased or allowed a limited degree of forward bias. The purpose of the comparator 102 is to prevent *excessive* forward bias, which causes the parasitic transistor to conduct. In the illustrated embodiment, conduction might occur at a forward bias of 0.6 V. Accordingly, the comparator has been selected to trip at a forward bias of 0.4 V, allowing a margin of 0.2 V. Providing the comparator 102 with an input offset of 0.4 V can be achieved by a number of well known methods including choosing the appropriate size input transistor (see FIG. 9) or selectively implanting an input transistor to alter the MOS threshold.

It is further noted that in the device described above, the substrate is connected directly to the input power supply. While this circuit example provides a good illustration of many features of the present invention, it is recognized that in many applications, the monolithic substrate is not connected directly to a low impedance supply.

Figure 6:
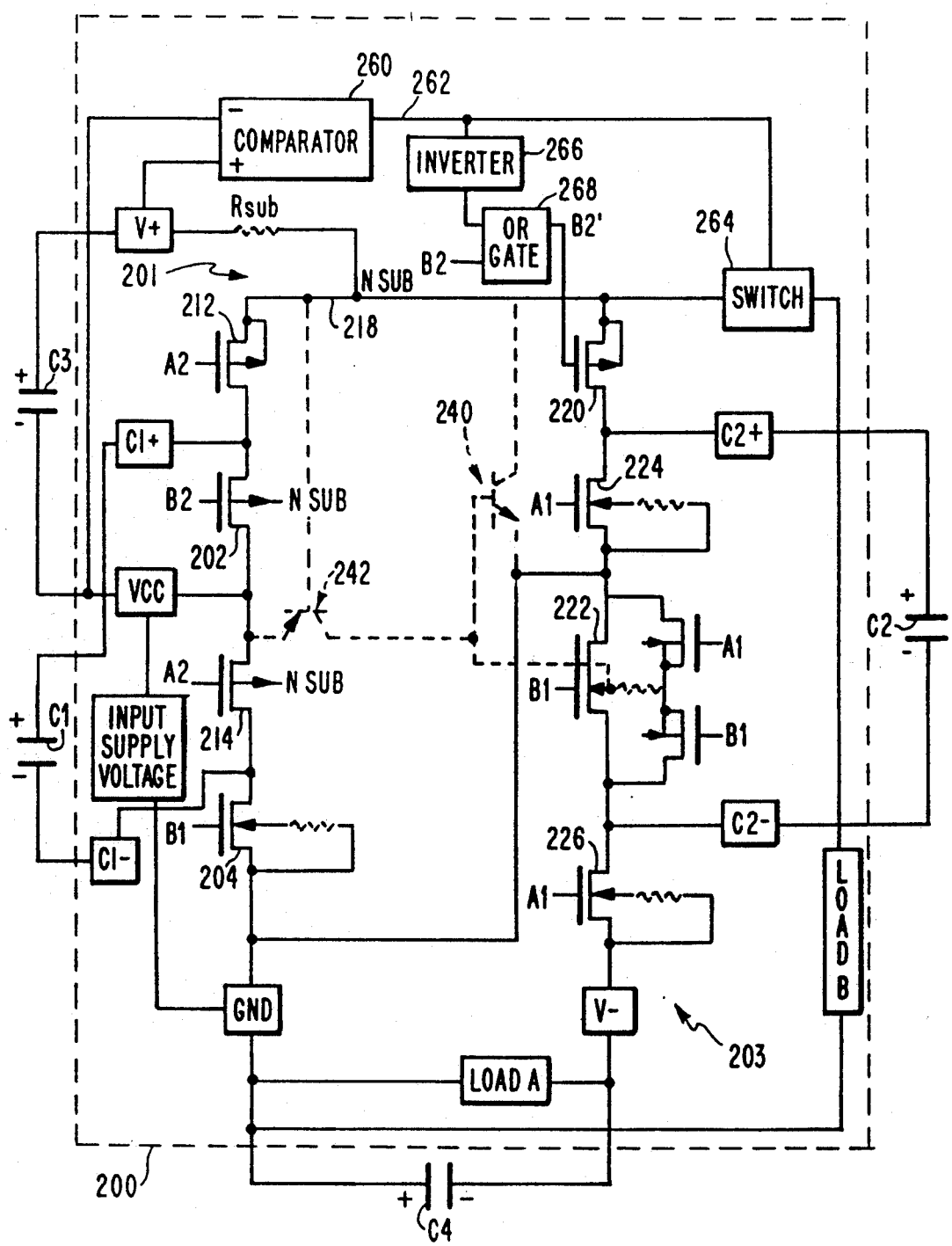
FIG. 6 is a schematic diagram of a dual charge pump circuit in accordance with another embodiment of the present invention.

The following example illustrates the application of the present invention to a device having a floating substrate, commonly encountered in power supply circuits and MOS memories. Referring now to FIG. 6, a dual charge pump circuit is shown which has been modified in accordance with a second embodiment of the present invention to prevent latch up. The dual charge pump circuit, indicated generally at 200, is fabricated as a portion of an integrated circuit (IC) using a P— well CMOS process, and includes a charge pump circuit 201 which provides a positive supply voltage which is twice that of the positive input supply voltage. In addition, the doubled voltage is inverted by a second charge pump circuit 203 to provide a negative supply voltage of twice the magnitude of the input supply voltage.

Doubler circuits in such P-well CMOS circuits usually have a floating substrate since the substrate potential typically must change with respect to the supply voltages as the circuit commences operation. Because the substrate is common to the device, it is difficult to isolate the effects of changes in the substrate potential. As a result, if the substrate potential falls below the most positive supply potential, latch-up can ensue.

Voltage inverter circuits, on the other hand, may only require floating wells in a P-well CMOS circuit. Floating wells pose less of a design constraint since they can be isolated from each other. However, the inverter circuit can cause a large transient current drain on the substrate to significantly increase the chance of latch-up. As will be explained in greater detail below, the present invention can eliminate latch-up even in devices having floating substrates.

The charge pump circuit 200 includes four capacitors C1, C2, C3 and C4 which are external to the IC. Upon the application of the input supply voltage across the VCC and GND terminals of the IC, the substrate of the IC is brought up to the supply voltage (5 volts, in the illustrated embodiment) through the capacitor C3 which is initially uncharged. During a first clock phase, the input supply voltage is applied across the capacitor C1 of the first charge pump circuit 201 through a P-channel transistor switch 202 and an N-channel transistor switch 204, charging the capacitor C1 to the input supply voltage. The transistor switches 204 and 202 are controlled by a pair of control signals B1 and B2, respectively, which are generated by a clock circuit 210 of FIG. 7. The output waveforms of the clock circuit 210 are illustrated in FIG. 8. During clock phase 1 of FIG. 8, the control signal B1 assumes a high state which turns on the N-channel transistor switch 204. Similarly, the control signal B2 which assumes a low state in clock phase 1, turns on the P-channel transistor switch 202, coupling the supply voltage across the external capacitor C1, as described above.

During the next clock phase (phase 2), the control signals B1 and B2 change states so that the transistor switches 202 and 204 are turned off. Also, a pair of P-channel transistors 212 and 214 are turned on by control signal A2 of the clock circuit 210 of FIG. 7, which connects the capacitor C1 in series with the input supply voltage. In addition, the voltage on the capacitor C1 is applied across the capacitor C3, charging the capacitor C3 through the substrate and raising the substrate potential at node 218 to twice the voltage of the input supply voltage after many charge pumping cycles. In this manner, a voltage equal to twice the input supply voltage is made available to power a load such as load B.

The second charge pump circuit 203 includes the external capacitor C2 which is initially connected at one end to the substrate at node 218 and at the other end to ground thereby charging the capacitor C2 to a potential equal to twice the input supply voltage. This connection is provided by a P-channel transistor 220 and an N-channel transistor 222 which are turned on by the control signals B2' and B1, respectively. During the next clock phase, the transistor switches 220 and 222 are turned off and a pair of N-channel transistors 224 and 226 are turned on by the control signal A1 to connect capacitors C2 and C4 in parallel across ground and V—, charging the reservoir capacitor C4 to minus twice the input voltage ($-2 V_{cc}$) at node V—. This negative supply voltage is available to power load A.

The integrated circuit 200 of FIG. 6 has an N— type substrate. The N-channel transistors 204, 222, 224 and 226 of the circuit 200 are formed in P— wells. Each N— type diffusion region together with the underlying P— well and substrate can potentially form a vertical parasitic NPN bipolar transistor as previously described. One such parasitic NPN transistor is indicated in phantom at 240. Similarly, each P+ diffusion together with the adjacent substrate and a nearby P— well can potentially form a lateral parasitic PNP transistor as indicated in phantom at 242, for example.

As noted above, the substrate of the integrated circuit 200 is not directly coupled or "hard-wired" to a fixed supply voltage. Consequently, the potential of the substrate is in general governed by circuit operation. For example, if capacitor C2 of the second charge pump is larger than capacitor C3 of the first charge pump, the second charge pump can excessively drain the first charge pump, lowering the substrate potential to dangerous levels. Similarly, load B can excessively load the first charge pump. This condition can particularly occur at start up, if the reservoir capacitors C2 and C4 have not yet acquired their respective full charges.

If the substrate potential falls below the input supply voltage, the base-emitter junction of the parasitic PNP transistor 242 can become forward biased to a degree which will turn on the transistor 242. Because the PNP and NPN parasitic transistors 242 and 240 are coupled together by the shared substrate and P— well, the NPN transistor 240 can be turned on as well, resulting in latch up of the SCR structure.

In order to prevent the SCR from causing latch up, in accordance with the present invention, a comparator 260 is provided to monitor the bias of the base-emitter junction of the parasitic PNP transistor 242. Specifically, the comparator 260 has an inverting input coupled to the input supply voltage terminal VCC and a non-inverting input coupled to the substrate via the IC terminal V+. The output 262 of the comparator 260 is applied to the input of a MOSFET switch 264 between the load B and the substrate node 218. So long as the potential of the substrate falls no lower than 0.4 V below the input supply voltage, the output 262 of the comparator 260 will remain at a logical 1 state which turns on the switch 264 and couples the load B to the substrate node 218. However, should the potential of the substrate fall below this value, the comparator 260 will change its output, causing the switch 264 to turn off, thereby disconnecting the load B from the substrate and capacitor C3.

The output 262 of the comparator 260 is also coupled by an inverter 266 to one input of an OR gate 268. The other input of the OR gate 268 receives the control signal B2 from the clock circuit 210 of the FIG. 7. Again, so long as the potential of the substrate remains above the critical value, the control signal B2 will be transmitted through the OR gate 268 (as B') to the gate of the transistor switch 220. However, a logical zero output of the comparator 260 indicating an impending excessive forward biasing of the parasitic PNP transistor 242 causes the OR gate 268 to block the application of the control signal B2 to the P-channel transistor switch 220. In this manner, the transistor switch 220 is not permitted to turn on, disabling the second charge pump circuit 202 and preventing the draining of the substrate and capacitor C3 by the capacitor C2 of the second charge pump. The second charge pump circuit 202 will remain disabled and the load B will remain disconnected until the potential of the substrate rises sufficiently to allow the comparator 260 to resume its logical one output. In this manner, the avoidance of inadvertent excessive forward biasing of the parasitic PNP transistor and resulting turn on of the parasitic SCR structure is ensured. A similar comparator and corresponding logic circuitry may be added to other portions of this circuit or other circuits where the risk of latch up is deemed unacceptably high.

Figure 7:
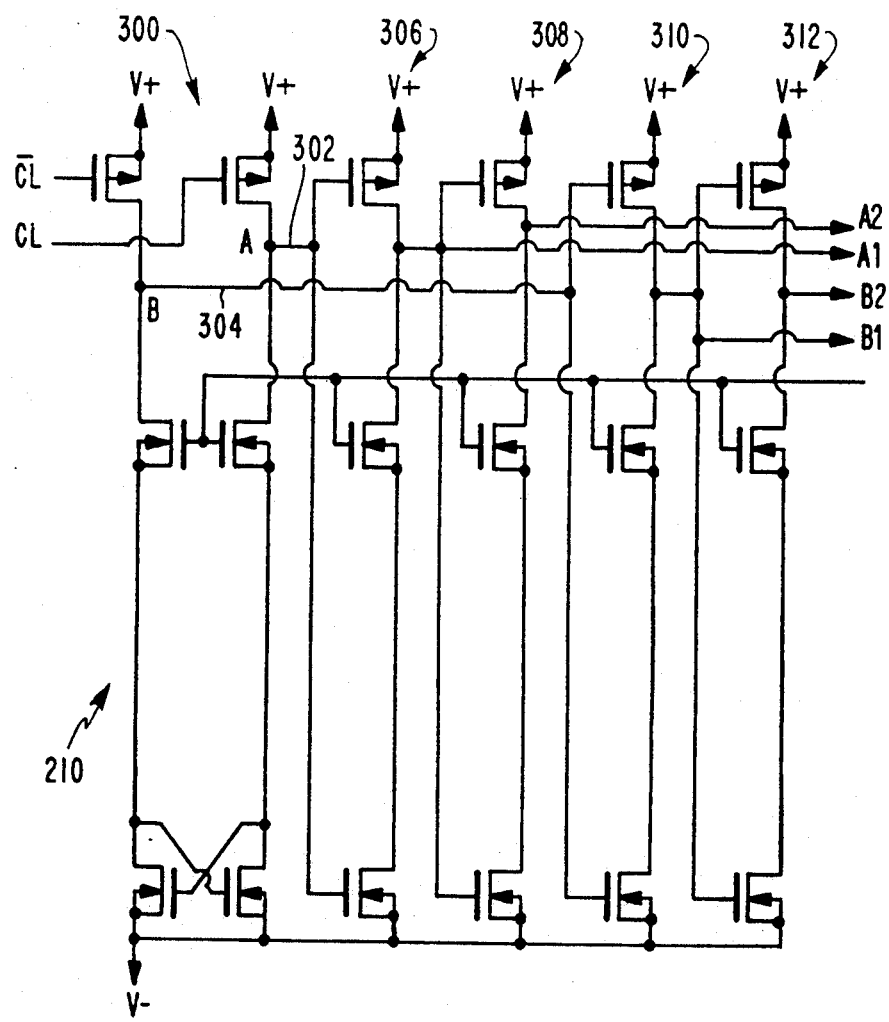
FIG. 7 is a schematic diagram of a clock circuit for the charge pump circuit of FIG. 6.
Figure 8:
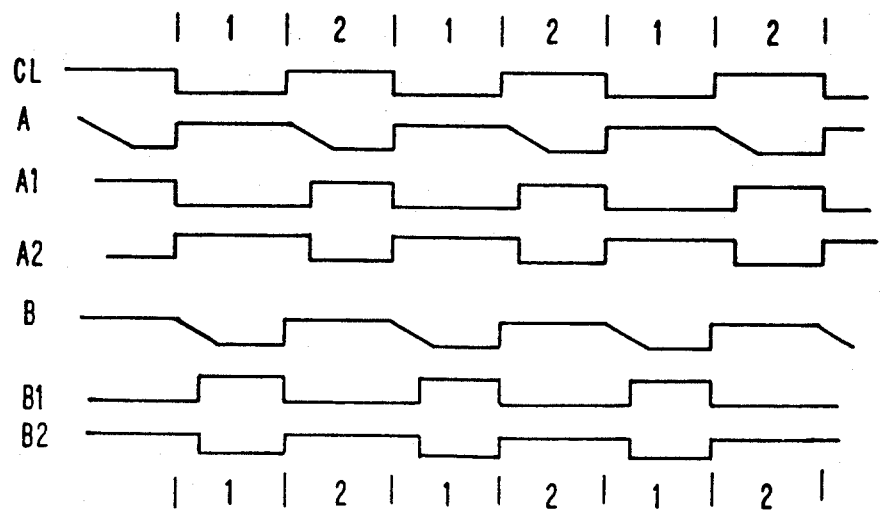
FIG. 8 is a timing diagram showing the waveforms of the clock signals of the clock circuit of FIG. 7.

The clock circuit 210 of FIG. 7 for generating the clock control signals A1, A2, B1 and B2 includes a CMOS flip-flop 300 which receives the clock input signals CL and $\overline{CL}$ and generates the output signals A and B at outputs 302 and 304, respectively. The relationship between the control signals A and B and the input signal CL is illustrated in FIG. 8.

The control signal A output 302 is coupled to the input of a CMOS inverter output stage 306 which generates the control signal A1 as depicted in FIG. 8. A second CMOS inverter output stage 308 receives the A1 output signal from the output stage 306 and produces the control signal A2 which as shown in FIG. 8 is, substantially control signal A1 but inverted. The control signals B1 and B2 are produced from the control signal B by output stages 310 and 312, respectively, in a similar manner.

Figure 9:
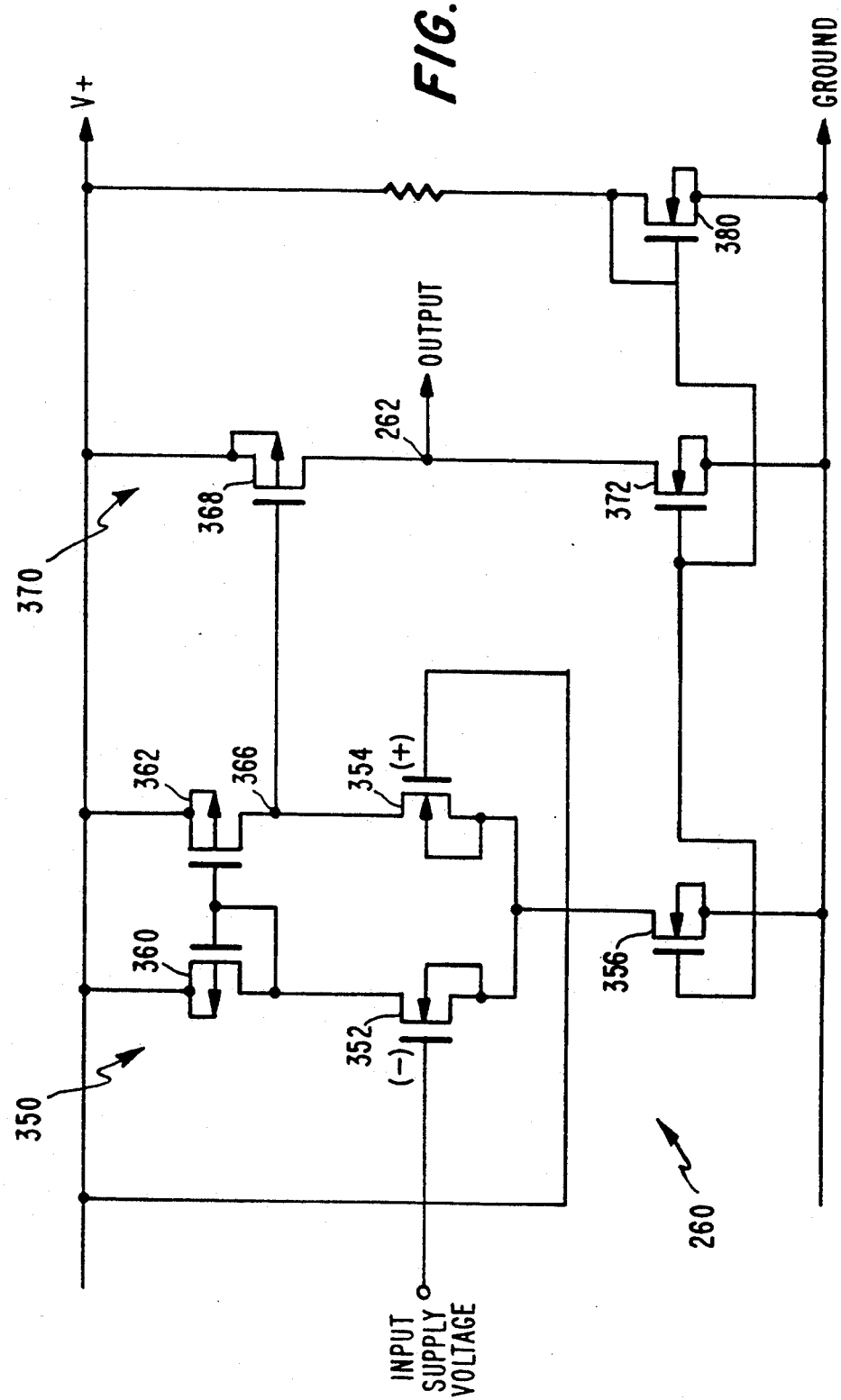
FIG. 9 is a schematic diagram of a comparator circuit for the charge pump circuit of FIG. 6.

Referring now to FIG. 9, the comparator circuit 260 of FIG. 6 is shown in greater detail. The comparator 260 includes a differential pair of N-channel input transistors 352 and 354. The gate of the N-channel transistor 354 is designated the non-inverting (+) input of the comparator 260 and is coupled to the input supply voltage. The gate of the other N-channel input transistor 352 comprises the inverting input and is coupled to the substrate.

The comparator 260 further includes a current source transistor 356 and a pair of current mirror P-channel transistors 360 and 362 coupled to the input transistors 352 and 354, respectively. The output of the differential pair 350 at node 366 is coupled to the gate of the P-channel transistor 368 of a CMOS inverter output stage 370. The gate of the N-channel transistor 372 of the inverter output stage 370 is coupled to the gates of the current source transistor 356 of the differential pair 350 and another N-channel transistor 380 which biases the N-channel transistors 356 and 372.

In operation, when the substrate voltage is higher than that of the input supply voltage, the output of the comparator at 262 produces a high output or logical 1. Should the potential of the substrate fall by more than 0.4 of a volt or any other appropriate offset below that of the input supply voltage, the comparator produces a low output or logical zero, indicating a fault condition. In response, the logic circuitry of FIG. 6 disables the second charge pump and uncouples load B from the first charge pump to allow the substrate voltage to return to a level above that of the input supply voltage. Alternatively, in FIG. 4, a transistor switch is disabled to reduce current flow in response to such a fault condition as indicated by a similar comparator. In this manner, latch-up in integrated circuits can be avoided.

It will, of course, be understood that modifications of the present invention, in its various aspects, will be apparent to those skilled in the art, some being apparent only after study and others being matters of routine electronic design. For example, it is recognized that the base-emitter junction of the NPN transistor may be monitored as well. Accordingly, the potential of a well may be monitored if that is where the base-emitter junction of a parasitic transistor is formed. Furthermore, the invention is applicable to BIMOS devices and using devices technologies such as silicon, gallium, arsenide and germanium fabrication techniques. Still further, the invention may also be used in circuits utilizing inductive switching techniques where substrates and wells are switched between different potentials. Similarly, circuits that are exposed to high voltage inputs which exceed the supply rails may also be susceptible to latch up. Other applications include integrated circuits having geometry and diffusion depths which mandate unavoidably high parasitic bipolar gain. Still other embodiments are also possible, with their specific designs depending upon the particular application. As such, the scope of the invention should not be limited by the particular embodiments herein described but should be defined only by the appended claims and equivalents thereof.

We claim:

1. In an integrated circuit having a parasitic silicon controlled rectifier (SCR) comprising a lateral bipolar transistor having a collector region in common with the base region of a vertical bipolar transistor, the improvement comprising:
   means coupled to the base region of at least one of the lateral and vertical bipolar transistors of the SCR for monitoring the bias of the base-emitter junction of said at least one the lateral and vertical bipolar transistors of the SCR; and
   means responsive to the monitoring means connected in circuit within said base-to-emitter junction of a least one of the lateral and vertical bipolar transistors for controlling the current therethrough and for maintaining a bias across the base-emitter junction which prevents activation of the SCR;
   wherein latch-up of the integrated circuits is prevented.

2. The circuit of claim 1 wherein the monitoring means monitors the bias of the base-emitter junction of the lateral bipolar transistor of the SCR.

3. The circuit of claim 1 wherein the monitoring means monitors the bias of the base-emitter junction of the vertical bipolar transistor of the SCR.

4. The circuit of claim 1 wherein the monitoring means comprises a comparator for comparing the voltage of one of the regions of said base-emitter junction to a predetermined voltage and wherein said maintaining means comprises means for altering the voltage of a region of the base-emitter junction.

5. The circuit of claim 1 wherein the monitoring means comprises a comparator for comparing the potential of the substrate adjacent said base-emitter junction to a predetermined voltage.

6. The circuit of claim 5 wherein the maintaining means comprises means for reducing the flow of current to the substrate in response to the comparator.

7. The circuit of claim 1 further comprising a transistor switch formed in the substrate, wherein the maintaining means comprises means for reducing the flow of current through the transistor switch in response to the monitoring means.

8. The circuit of claim 5 wherein the maintaining means comprises means responsive to the comparator for disabling portions of the circuit to reduce the drain on the substrate.

9. The circuit of claim 5 wherein the maintaining means comprises switch means responsive to the comparator means for disconnecting a portion of the circuit loading the substrate from the substrate to reduce the load on the substrate.

10. In an integrated circuit having a substrate and a parasitic silicon controlled rectifier (SCR) formed in the substrate, the SCR comprising a lateral bipolar transistor having a collector region in common with the base region of a parasitic vertical bipolar transistor, the improvement comprising:
   means coupled between the base and emitter regions of the lateral bipolar transistor for monitoring the bias of the base-emitter junction of the lateral bipolar transistor and providing a signal if the bias exceeds a predetermined value; and
   means responsive to the monitoring means coupled to one of the base and emitter of said lateral transistor for changing the potential of one of the base and emitter regions of the lateral transistor to ensure that the bias across the base-emitter junction remains below the predetermined value to prevent activation of the SCR.

11. In an integrated circuit for use with a power supply, said circuit having a floating potential substrate and a parasitic silicon controlled rectifier (SCR) formed in the substrate the SCR comprising a lateral bipolar transistor having a collector region in common with the base region of a vertical bipolar transistor, the improvement comprising:
   means coupled between a power terminal for receiving a power supply voltage and the base region of one of the lateral and vertical bipolar transistors comprising said SCR for comparing the potential of the supply voltage to the potential of the substrate adjacent the SCR; and
   means for changing the potential of the substrate adjacent said base region of the SCR to prevent activation of the SCR.

12. In an integrated circuit for use with a power supply, said circuit having a substrate, and a well and a parasitic silicon controlled rectified (SCR) formed in the substrate, the improvement comprising:
   means coupled between a power terminal for receiving a power supply voltage and said well for comparing the potential of the supply voltage to the potential of the well adjacent the SCR; and
   means coupled to said well for changing the potential of the well adjacent the SCR to prevent activation of the SCR.

13. In a CMOS integrated circuit having transistors of one carrier type formed in a substrate of a first conductivity type, wells of an opposite conductivity type containing transistors of the opposite carrier type, and a parasitic SCR structure wherein the substrate forms the base region of a parasitic lateral bipolar transistor having a majority carrier of said one carrier type and the collector region of a vertical parasitic bipolar transistor of the opposite region of the lateral transistor and the (collector) emitter of the vertical transistor, the improvement comprising:
   means coupled to the base region of at least one of the lateral and vertical bipolar transistors for monitoring the bias of the base-emitter junction of at least one of the lateral and vertical transistors of the SCR; and
   means responsive to the monitoring means coupled to the base region of at least one of said lateral and vertical bipolar transistors for controlling the bias across the base-emitter junction to prevent excessive forward biasing of said base-emitter junction and activation of the SCR.

14. An integrated circuit, comprising:
   an input for receiving a supply voltage; a substrate of a first conductivity type; a well of a second conductivity type formed in the substrate;
   an insulated-gate field effect transistor IGFET of a first carrier type formed in the well;
   a second insulated-gate field-effect transistor (IGFET) of a second carrier type formed in the substrate; and said second IGFET having first and second gates;

a comparator coupled between said input and and point on said substrate adjacent said second IGFET for comparing the supply voltage to the potential of the substrate adjacent the second IGFET; and logic means coupled to the output of the comparator and to one of the gates of said second IGFET for disabling one of the gates of the second IGFET to reduce the flow of current to the substrate to increase the potential of the substrate adjacent to the second IGFET, to thereby prevent activation of the SCR.

15. In a dual charge pump integrated circuit for powering a load and having a substrate and a first charge pump circuit formed within the substrate for doubling the voltage of an input supply and a second charge pump circuit formed within the substrate for inverting the output of the first charge pump circuit, the improvement comprising:

means coupled to the substrate for monitoring the potential of the substrate in a locality susceptible to participate in a parasitic SCR turn on; and means coupled to the second charge pump circuit responsive to the monitoring means for disabling the second charge pump circuit when the potential at the substrate locality reaches a predetermined value.

16. The circuit of claim 15 further comprising means responsive to the monitoring means for disconnecting a load from a charge pump circuit when the potential at the substrate locality reaches a predetermined value.

17. A method for preventing latch up in an integrated circuit having a parasitic silicon controlled rectifier (SCR) comprising a lateral bipolar transistor having a collector region in common with the base region of a vertical bipolar transistor, the method comprising:

monitoring the bias of the base-emitter junction of at least one of the lateral and vertical bipolar transistors of the SCR; and in response to the monitoring means, maintaining a bias across the base-emitter junction which prevents activation of the SCR.

18. The method of claim 18 wherein the monitoring step monitors the bias of the base-emitter junction of the lateral bipolar transistor of the SCR.

19. The method of claim 18 wherein the monitoring step includes comparing the voltage of one of the regions of said base-emitter junction to a predetermined voltage and wherein the maintaining step includes altering the voltage of a region of the base- emitter junction.

20. The method of claim 17 wherein the monitoring step includes comparing the potential of the substrate adjacent said base-emitter junction to a predetermined voltage.

21. The method of claim 20 wherein the maintaining step includes reducing the flow of current to the substrate in response to the comparator.

22. The method of claim 17 wherein the circuit comprises a transistor switch formed in the substrate, and wherein the maintaining step includes reducing the flow of current through the transistor switch in response to the results of the monitoring step.

23. The method of claim 20 wherein the maintaining step includes disabling portions of the circuit to reduce the drain on the substrate.

24. The method of claim 20 wherein the maintaining step includes disconnecting a portion of the circuit loading the substrate from the substrate to reduce the load on the substrate.

* * * * *